(12) United States Patent
Gustafsson et al.

(10) Patent No.: US 6,449,321 B1
(45) Date of Patent: Sep. 10, 2002

(54) RADIO RECEIVER

(75) Inventors: Kjell Gustafsson; Roozbeh Atarius, both of Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/042,534

(22) Filed: Mar. 17, 1998

(30) Foreign Application Priority Data

Mar. 18, 1997 (GB) ............................................. 9705581

(51) Int. Cl.[7] ............................. H03D 1/24; H04L 25/06

(52) U.S. Cl. ........................ 375/322; 375/324; 375/319

(58) Field of Search ................................. 375/316, 322, 375/324, 319; 329/304, 306

(56) References Cited

U.S. PATENT DOCUMENTS 5,144,256 A    9/1992   Lim ........................... 329/302

FOREIGN PATENT DOCUMENTS

| DE | 39 38 643 | 5/1990 |
| DE | 42 38 543 | 5/1994 |
| EP | 0 594 894 | 5/1994 |
| EP | 0 598 277 | 5/1994 |
| EP | 0 658 993 A1 | 6/1995 |
| EP | 0693750 | 1/1996 |
| GB | 2 267 629 A | 8/1993 |

*Primary Examiner*—Temesghen Ghebretinsae
(74) *Attorney, Agent, or Firm*—Burns, Doane, Swecker & Mathis, L.L.P.

(57) ABSTRACT

A receiver circuit allows extracting information from baseband components of a received signal. Means are disclosed for removing constant disturbance components from the baseband signal components.

10 Claims, 2 Drawing Sheets

RADIO RECEIVER

TECHNICAL FIELD OF THE INVENTION

This invention relates to a radio receiver, and in particular to a method of demodulating received signals.

DESCRIPTION OF RELATED ART

Many radio transmission systems rely on frequency modulation. That is, information is encoded in the phase or frequency of a carrier signal.

One known way of decoding the information in a radio receiver is to apply a frequency conversion to the received signal, to remove the carrier signal, leaving the baseband modulated signal. However, this method has the disadvantage that the modulated signal which is detected may include offset components, and it is difficult to eliminate these offsets, without also eliminating a part of the wanted signal.

As a result of the problems which arise when dealing with signals at baseband, it is more common to convert received signals to an intermediate frequency for demodulation.

SUMMARY OF THE INVENTION

As mentioned above, there are problems associated with conventional methods of demodulating signals at baseband. However, the present invention is concerned with attempting to solve these problems, by allowing the elimination of constant disturbance components of the signals. The ability to achieve accurate demodulation of baseband components is of particular advantage in receivers which are intended to process two or more different types of signals, because various components can then be used to process both types of signal.

In order to be able to eliminate constant disturbance components of the baseband signals, it is first necessary to be able to detect such components.

In some cases, it will be known that the mean values of the undistorted components of the signal should be zero, in which case the actual mean values can be determined to be the distortion components. In other cases, the detected signal can be subject to an initial processing so that, in the absence of distortion, it should have a zero mean, in which case, again, any actual mean value can be taken to be a distortion component. In other situations, relationships between two components of the baseband signal can be used to determine whether there is any constant disturbance component.

DETAILED DESCRIPTION OF PREFERRED EMBODIMENTS

Figure 1:
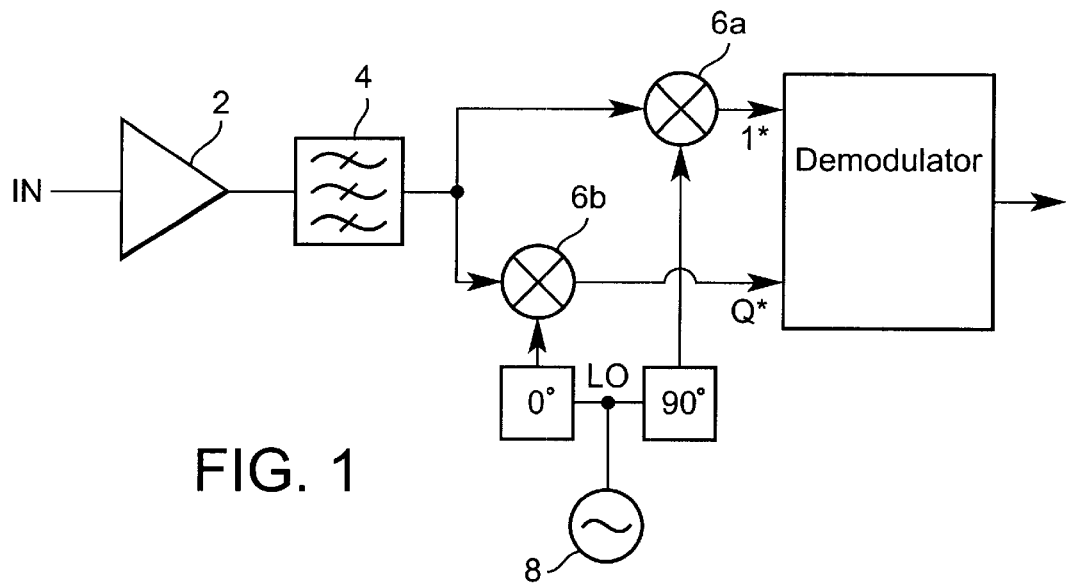
FIG. 1 is a schematic representation of a front-end of a receiver in accordance with the invention.

FIG. 1 is a schematic representation of a typical front-end of a receiver circuit in accordance with the invention. A signal IN received at an antenna passes to an amplifier 2, a band-pass filter 4 and a pair of mixers 6a, 6b, which also receives in-phase and quadrature local oscillator signals, derived from a signal LO, produced by an oscillator 8. The mixers 6a, 6b output in-phase and quadrature baseband components of the input signal. Typically, the in-phase and quadrature components I and Q also contain constant disturbance components $I_o$, and $Q_o$, such that the components output from the mixers 6a, 6b can be regarded as $I^*(=I+I_o.)$ and $Q^*(=Q+Q_o)$.

For example, the local oscillator signal LO may leak into the modulated signal at the mixer input. The oscillator signal then mixes with itself and creates a constant signal at the mixer output. Although such constant disturbances can be removed by using a high pass filter, this option is unavailable if the modulated signal may contain constant components in I and/or Q, because such filtering will also remove those components.

The present invention therefore seeks to find a way of removing constant disturbances, while retaining constant components in the modulated signal.

Figure 2:
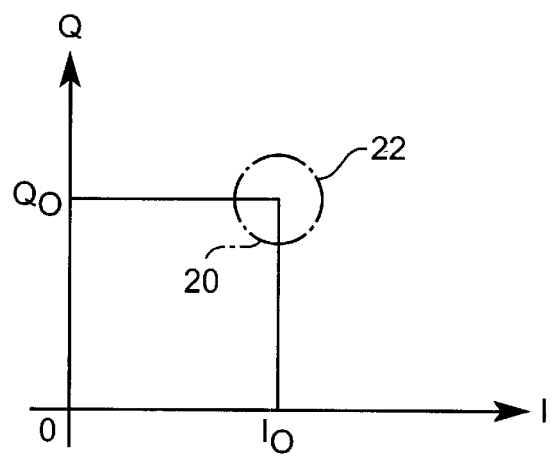
FIG. 2 is a graphical representation of components of a modulated signal.

FIG. 2 is a graphical representation of the in-phase I and quadrature Q components of the modulated signal. As is well known to the person skilled in the art, these components lie on a circle 20. If the modulation index of the signal is large enough, the components will cover the whole circle. However, FIG. 2 illustrates a signal with a small modulation index, which only covers the part 22 of the circle illustrated by a solid line. In the absence of any disturbance components, the centre of the circle 20 would be at the origin, that is I=Q=0. However, in the presence of constant disturbance components $I_o$, $Q_o$, the centre of the circle is offset to the point defined by these offset components.

The present invention is concerned with methods which examine the detected components I* and Q* in order to be able to detect and eliminate the constant disturbance components $I_o$, $Q_o$.

It will be apparent from an examination of FIG. 2 that, if the modulation index of the signal is large enough, that is, if the I and Q components trace out the whole of the circle 20, it is a relatively straightforward matter to calculate $I_o$, and $Q_o$ as the time-averages of the I and Q components, or as the mid-points between the extreme values of the I components and Q components respectively. However, it will be equally apparent that this will not work successfully in the case illustrated in FIG. 2, where the modulation index is small, and the signal covers only a part of the circle 20.

Figure 3:
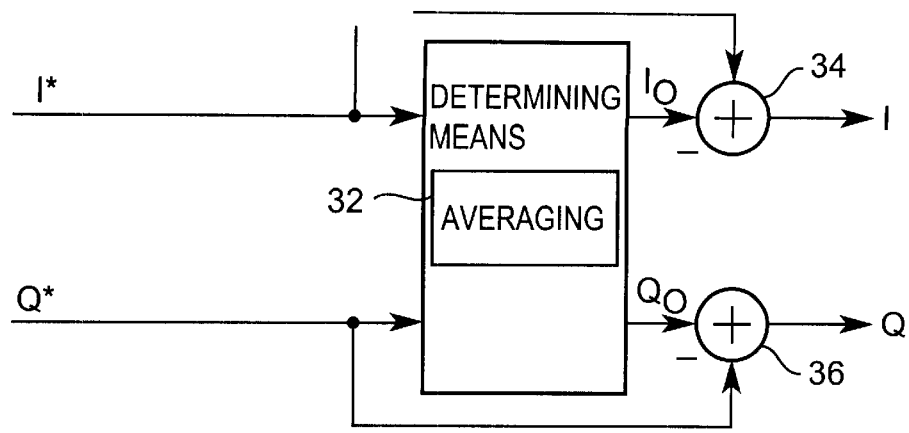
FIG. 3 is a block schematic diagram of a part of a receiver circuit in accordance with the invention.

FIG. 3 is a block schematic diagram of a circuit which allows this relatively simple technique to be used. It was mentioned above, with reference to FIG. 1, that a local oscillator signal is used to downconvert the received RF signals to baseband. In this embodiment of the invention, a small offset is added to the LO frequency, so that the downconversion to baseband results in a signal which has a small (non-zero) carrier frequency. This means that the I and Q components rotate slowly around the circle 20 shown in FIG. 2. The result is that these components I*, Q* have zero means, in the absence of any disturbance components.

In FIG. 3, the components I* and Q*, obtained from the front-end shown in FIG. 1, are supplied to an averaging circuit 32, and their respective averages are taken to be the constant offset components $I_o$, $Q_o$, which are then passed to respective subtractors 34, 36. I* and Q* are respectively fed to the other inputs of the subtractors 34, 36, such that they respectively output the I and Q components with the constant disturbances eliminated.

The rotation, which is added by means of the offset to the LO frequency, must be slow enough not to jeopardise the decoding of the transmitted information, but the averaging must take place over a time period which is long enough to allow the signal to cover the whole circle.

Figure 4:
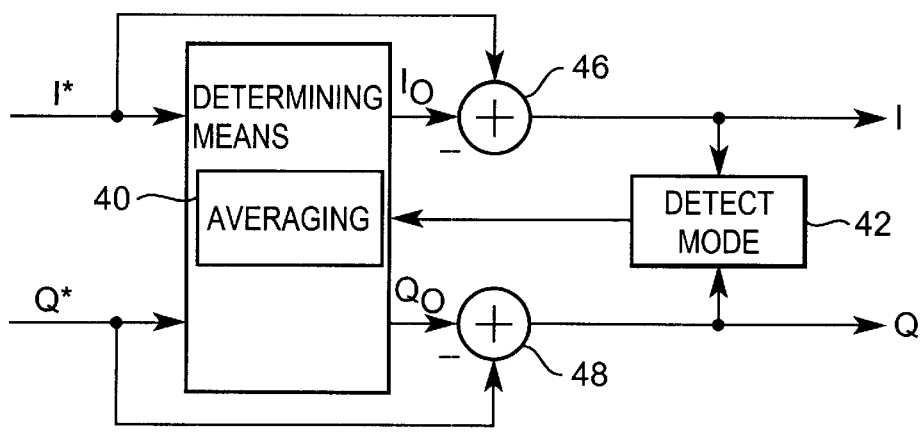
FIG. 4 is a block schematic diagram of a part of a second receiver circuit in accordance with the invention.

FIG. 4 is a block schematic diagram of an alternative arrangement, particularly suitable for use in situations in which it is known that the incoming signal has a large modulation index, and that the I and Q components are expected to be zero mean at regular intervals during transmissions. One example of this is in communications based on the AMPS mobile telephony standard, in which the carrier signal is zero mean in the mode where the Manchester modem is used to transmit signalling data.

Thus, in FIG. 4, the detected components I* and Q* from the front end shown in FIG. 1 are sent to an averaging circuit 40, as well as to respective subtractors 46, 48. Average values $I_o$ and $Q_o$, output from the averaging circuit 40, are sent to the other inputs of the subtractors 46, 48, and the respective outputs are used as the I and Q components for demodulation. A mode detector 42 examines the output I and Q components, to determine periods when signalling data are being transmitted such that the components of the modulated signals can be expected to have zero means. A control signal is sent from the mode detector 42 to the averaging circuit 40 to determine when the latter acts to produce an updated estimate of $I_o$ and $Q_o$. At other times, the last calculated versions of $I_o$ and $Q_o$ are used.

Figure 5:
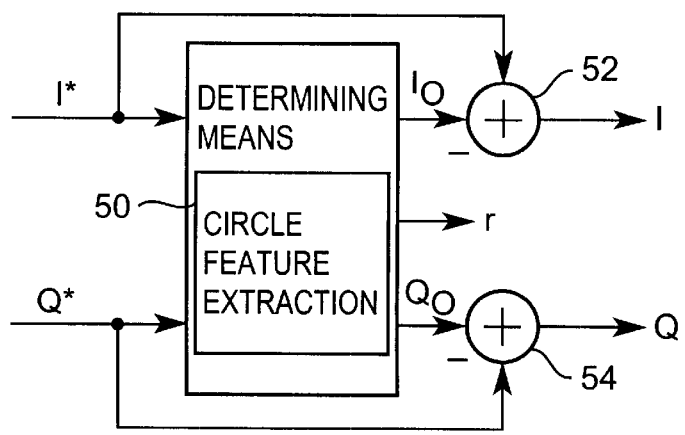
FIG. 5 is a block schematic diagram of a part of a third receiver circuit in accordance with the invention.

FIG. 2 also illustrates that it is possible to locate the centre of the circle 20 by purely geometric means, taking measured I and Q values at particular times as the co-ordinates of points in I/Q space, with the constant disturbance components then being the centre of a circle on which those points lie. FIG. 5 is a block schematic diagram of a circuit which operates in this way.

Components I* and Q* from the front-end shown in FIG. 1 are supplied to a circle feature extraction processor 50, as well as to respective subtractors 52, 54. The processor 50 determines the centre of the circle defined by $I_o$ and $Q_o$, and supplies these components as outputs to the respective subtractors 52, 54, such that the subtractors give the component values I and Q, with the constant disturbance components eliminated, as their outputs.

The processor 50 can use any or all of a variety of geometrical and algebraic techniques. For example, each instantaneously measured pair of values of I* and Q*, namely I*(n), Q*(n) satisfies the equation:

$$[I^*(n)-I_o]^2+[Q^*(n)-Q_o]^2=r^2,$$

where r is the radius of the circle.

By examining sufficient pairs of component values, it is possible to obtain a numerical solution to this equation for $I_o$, $Q_o$ and r.

Secondly, it is a known feature of a circle that a tangent at any point is perpendicular to the radius. Therefore, by examining the pairs of component values in the region of one point, it is possible to produce an accurate estimation of the orientation of the tangent at that point, and hence of the radius which passes through that point. By carrying out this procedure for several points, it is possible to produce an accurate estimation of the position of the centre of the circle, as the point at which the various radii intersect.

Thirdly, it is possible to use the feature that the centre of a circle, with radius r, also lies on every circle, of radius r, centred on a point on the first circle. Thus, taking two pairs of component values, and taking them as centres, pairs of circles with varying radii can be defined. Those pairs of circles intersect along a line. This procedure can be repeated for different pairs of component values, acting as pairs of centres, to produce another such line. All such lines met at the centre of the circle on which the component values lie.

There is thus described a method of determining, and hence being able to eliminate, constant disturbance values in a received signal.

What is claimed is:

1. A method of signal demodulation comprising:

converting the signal to baseband;

detecting I and Q components of the baseband signa;:

determining constant disturbance components of the detected I and Q components; and subtracting the determined constant disturbance components from the detected I and Q components, wherein the step of determining constant disturbance components of the detected I and Q components comprises:

taking the detected I and Q components of the baseband signal as coefficient of points in I/Q space, and calculating the constant I and Q disturbance components as the centre of a circle on which the points lie.

2. A method of signal demodulation comprising:

converting the signal to baseband;

detecting I and Q components of the baseband signal;

determining constant disturbance components of the detected I and Q components; and subtracting the determined constant disturbance components from the detected I and Q components, wherein the step of determining constant disturbance components of the detected I and Q components comprises:

detecting times at which undistorted I and Q components are expected to be approximately zero-mean; and calculating the constant I and Q disturbance components as the means of the detected I and Q components at those times.

3. A method of signal demodulation comprising:

converting the signal to baseband;

detecting I and Q components of the baseband signal by converting the signal to baseband using a local oscillator signal having a small frequency offset such that undistorted I and Q components become approximately zero-mean;

determining constant disturbance components of the detected I and Q components by calculating constant I and Q disturbance components as the means of the detected I and Q components; and subtracting the determined constant disturbance components from the detected I and Q components.

4. A correction circuit for a received RF signal, comprising:

at least one input for receiving baseband in-phase (I) and quadrature (Q) components of the received signal;

means for determining constant I and Q disturbance components of the baseband components;

at least one subtraction circuit for removing the constant I and Q disturbance components from the baseband components; and means for processing the received I and Q components of the baseband signal as coefficients of points in I/Q space, and calculating the constant I and Q disturbance components as the centre of a circle on which the points lie.

5. A correction circuit for a received RF signal, comprising:

at least one input for receiving baseband in-phase (I) and quadrature (Q) components of the received signal;

means for determining constant I and Q disturbance components of the baseband components;

at least one subtraction circuit for removing the constant I and Q disturbance components from the baseband components;

means for detecting time periods at which undistorted I and Q components are expected to be approximately zero-mean; and an averaging circuit for calculating the constant I and Q disturbance components as the means of the detected I and Q components during those time periods.

6. A correction circuit for a received RF signal comprising:

means for detecting baseband in-phase and quadrature components such that they become approximately zero-mean;

means for determining constant disturbance components of the baseband components;

at least one subtraction circuit for removing the constant disturbance components from the baseband components; and wherein the means for determining the constant disturbance components comprises an averaging circuit for calculating the constant disturbance components as the means of the detected baseband in-phase and quadrature components and wherein the means for detecting the baseband in-phase and quadrature components comprises a local oscillator, the frequency of which includes a small offset.

7. A receiver circuit, comprising:

means for converting a received modulated signal to a baseband modulated signal;

means for detecting I and Q components of the baseband modulated signal;

means for estimating constant error components of the detected I and Q components;

means for subtracting the estimated constant error components from the detected I and Q components; and means for processing the detected I and Q components of the baseband signal as coefficients of points in I/Q space, and calculating the constant error components as the centre of a circle on which the points lie.

8. A receiver circuit as claimed in claim 7, further comprising:

means for demodulating the resulting signal.

9. A receiver circuit comprising:

means for converting a received modulated signal to a baseband modulated signal;

means for detecting I and Q components of the baseband modulated signal;

means for estimating constant error components of the detected I and Q components;

means for subtracting the estimated constant error components from the detected I and Q components; and means for detecting time periods at which undistorted I and Q components are expected to be approximately zero-mean; and an averaging circuit for calculating the constant error components as the means of the detected I and Q components during those time periods.

10. A receiver circuit, comprising:

means for converting a received modulated signal to a baseband modulated signal;

means for detecting I and Q components of the baseband modulated signal;

means for estimating constant error components of the detected I and Q components;

means for subtracting the estimated constant error components from the detected I and Q components;

a local oscillator signal generator, and means for mixing a local oscillator signal with the received modulated signal to obtain I and Q components of the baseband modulated signal, the local oscillator frequency including a small offset such that undistorted I and Q components become approximately zero-mean; and an averaging circuit for calculating constant I and Q disturbance components as the means of the detected I and Q components.

* * * * *

UNITED STATES PATENT AND TRADEMARK OFFICE
CERTIFICATE OF CORRECTION

PATENT NO.    : 6,449,321 B1
DATED         : September 10, 2002
INVENTOR(S)   : Gustafsson et al.

It is certified that error appears in the above-identified patent and that said Letters Patent is hereby corrected as shown below:

Column 4,
Line 9, replace "converting the signal to baseband" with -- converting the signal to a baseband signal --;
Line 10, replace "signa;:" with -- signal --; and
Line 18, replace "coefficient" with -- coefficients --

Signed and Sealed this

Twenty-second Day of April, 2003

JAMES E. ROGAN
*Director of the United States Patent and Trademark Office*